(12) United States Patent
Campbell et al.

(10) Patent No.: US 7,492,593 B2
(45) Date of Patent: Feb. 17, 2009

(54) COOLED ELECTRONICS SYSTEM EMPLOYING AIR-TO-LIQUID HEAT EXCHANGE AND BIFURCATED AIR FLOW

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/049,632

(22) Filed: Mar. 17, 2008

(65) Prior Publication Data

US 2008/0158815 A1      Jul. 3, 2008

Related U.S. Application Data

(63) Continuation of application No. 11/467,245, filed on Aug. 25, 2006, now Pat. No. 7,397,661.

(51) Int. Cl.
*H05K 7/20*      (2006.01)
(52) U.S. Cl. .................. 361/696; 361/690; 361/695; 165/104.33; 174/16.1; 454/184
(58) Field of Classification Search .................. None
See application file for complete search history.

(56) References Cited

U.S. PATENT DOCUMENTS

| | | |
|---|---|---|
| 5,150,277 A | 9/1992 | Bainbridge et al. |
| 5,467,250 A | 11/1995 | Howard et al. |
| 5,896,922 A | 4/1999 | Chrysler et al. |
| 6,374,627 B1 | 4/2002 | Schumacher et al. |
| 6,506,111 B2 | 1/2003 | Sharp et al. |
| 6,544,309 B1 | 4/2003 | Hoefer et al. |
| 6,574,104 B2 | 6/2003 | Patel et al. |
| 6,628,520 B2 | 9/2003 | Patel et al. |
| 6,643,123 B2 | 11/2003 | Hartel et al. |
| 6,652,373 B2 | 11/2003 | Sharp et al. |
| 6,652,374 B2 | 11/2003 | Sharp et al. |
| 6,747,872 B1 | 6/2004 | Patel et al. |

(Continued)

*Primary Examiner*—Boris L Chervinsky
(74) *Attorney, Agent, or Firm*—Lily Neff, Esq.; Kevin P. Radigan, Esq.; Hesling Rothenberg Farley & Mesiti, P.C.

(57) ABSTRACT

Augmenting air cooling of electronics system using a cooling fluid to cool air entering the system, and to remove the heat dissipated by the electronics. A cooled electronics system includes a frame with drawers containing electronics components to be cooled. The frame includes a front with an air inlet and a back with an air outlet. A cabinet encases the frame, and includes a front cover positioned over the air inlet, a back cover positioned over the air outlet, and first and second side air returns at opposite sides of the frame. At least one air moving device establishes air flow across the electronics drawers. The air flow bifurcates at the back cover and returns to the air inlet via the first and second side air returns and the front cover. An air-to-liquid heat exchanger cools the air flowing across the electronics drawers.

16 Claims, 6 Drawing Sheets

U.S. PATENT DOCUMENTS

| | | |
|---|---|---|
| 6,775,137 B2 | 8/2004 | Chu et al. |
| 6,819,563 B1 | 11/2004 | Chu et al. |
| 6,867,967 B2 | 3/2005 | Mok |
| 6,877,551 B2 | 4/2005 | Stoller |
| 6,896,612 B1 | 5/2005 | Novotny |
| 6,924,981 B2 | 8/2005 | Chu et al. |
| 7,226,353 B2 | 6/2007 | Bettridge et al. |

US 7,492,593 B2

COOLED ELECTRONICS SYSTEM EMPLOYING AIR-TO-LIQUID HEAT EXCHANGE AND BIFURCATED AIR FLOW

CROSS-REFERENCE TO RELATED APPLICATION

This application is a continuation of U.S. patent application Ser. No. 11/467,245, filed Aug. 25, 2006, and published on Feb. 28, 2008 as U.S. Patent Publication No. US 2008/0049396 A1, entitled "Cooled Electronics System and Method Employing Air-to-Liquid Heat Exchange and Bifurcated Air Flow", by Campbell et al., the entirety of which is hereby incorporated herein by reference.

TECHNICAL FIELD

The present invention relates in general to cooling electronics systems. In particular, the present invention relates to facilitating air-cooling of electronics systems using a cooling fluid to cool air flow through an electronics system, and to remove heat produced by the electronics system.

BACKGROUND OF THE INVENTION

The power dissipation of integrated circuit chips, and the modules containing the chips, continues to increase in order to achieve increases in processor performance. This trend poses a cooing challenge at both the module and system level. Increased air flow rates are needed to effectively cool high power modules and to limit the temperature of air exhausted into the computer center.

In many large server applications, processors along with their associated electronics (e.g., memory, disk drives, power, etc.) are packaged in removable drawer configurations stacked or aligned within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, for example, through the use of a more powerful air moving device or by increasing the rotational speed (i.e., RPM) of an existing air moving device. However, this approach is becoming unmanageable at the frame level in the context of a computer installation (e.g., data center).

The sensible heat load carried by the air exiting the frame will eventually exceed the ability of room air conditioning to effectively handle the load. This is especially true for large installations of "server farms" or large banks of computer frames close together. In such installations, not only will the room air conditioning be challenged, but the situation may also result in recirculation problems with some fraction of the "hot" air exiting one frame being drawn into the air inlet of the same or a nearby frame. Furthermore, while the acoustic noise level of a powerful (or higher RPM) air moving device in a single drawer may be within acceptable acoustic limits, because of the number of air moving devices in the frame, the total acoustic noise at the frame level may not be acceptable. In addition, the conventional openings in the frame for the entry and exit of air flow make it difficult, if not impossible to provide effective acoustic treatment to reduce the acoustic noise level outside the frame. Finally, as operating frequencies continue to increase, electromagnetic cross talk between tightly spaced computer frames is becoming a problem largely due to the presence of the openings in the covers.

Recently, attempts have been made to address some of the issues noted above by combining air cooling with an air-to-liquid heat exchanger fixed within a server cabinet. Examples of this approach include the systems described in commonly assigned U.S. Pat. Nos. 6,819,563 and 6,775,137, both of which are incorporated herein by reference in their entirety. Notwithstanding these recent air and liquid cooling systems, there remains a need in the art for further improvements to cooling of rack-mounted electronics systems.

SUMMARY OF THE INVENTION

The shortcomings of the prior art are overcome, and additional advantages are realized through, in one aspect, the provision of a cooled electronics system which includes a frame, a cabinet encasing the frame, an air moving device for moving air within the cabinet, and at least one air-to-liquid heat exchanger. The frame, which includes at least one electronics drawer containing at least one electronics component to be cooled, has a front with an air inlet and a back with an air outlet for the ingress and egress of air flow across the at least one electronics drawer. The cabinet includes a front cover spaced from and positioned over the air inlet in the front of the frame, a back cover spaced from and positioned over the air outlet in the back of the frame, a first side air return at a first side of the frame and a second side air return at a second side of the frame. The air moving device moves air within the cabinet to establish an air flow across the at least one electronics drawer. With egress of the air flow through the air outlet of the frame, the air flow bifurcates at the back cover and returns to the air inlet of the frame via the first side air return, the second side air return and the front cover of the cabinet. The at least one air-to-liquid heat exchanger is disposed within the cabinet or the frame to facilitate cooling of the air flow across the at least one electronics drawer, and hence cooling of the at least one electronics device.

In another aspect, a cooled electronics system is provided which includes n frames, wherein n≧2, a cabinet encasing the n frames, multiple air moving devices for moving air within the cabinet encasing the n frames, and multiple air-to-liquid heat exchangers. Each frame of the n frames, which includes at least one electronics drawer containing at least one electronics component to be cooled, has a front with an air inlet and a back with an air outlet for the ingress and egress of air flow across the at least one electronics drawer. The cabinet includes n front covers and n back covers. Each front cover is spaced from and positioned over an air inlet in the front of a respective frame and each back cover is spaced from and positioned over an air outlet in the back of a respective frame. The cabinet further includes n+1 side air returns, with each frame having a side air return disposed on a first side and on a second side thereof. At least one side air return of the n+1 side air returns is a shared side air return disposed between two adjacent frames of the n frames. The multiple air moving devices establish air flow within each frame across the at least one electronics drawer thereof. With egress of the air flow through the air outlet in the back of each frame, the air flow bifurcates at the respective back cover, and returns to the air inlet of the frame via the two side air returns disposed on the first and second sides of the frame and the respective front cover. For at least two adjacent frames at least one side air return of the two side air returns on either side thereof is the at least one shared side air return. The at least one shared side air return receives a portion of the air flow exiting from both of its adjacent frames. The multiple air-to-liquid heat exchangers are disposed within at least one of the cabinet and the n frames to facilitate cooling of air flow across the at least one electronics drawer of each frame, and hence, cooling of the at least one electronics component therein.

In a further aspect, a method of cooling an electronics frame is provided. The method includes: providing a cabinet encasing a frame, the frame including at least one electronics drawer containing at least one electronics component to be cooled, and having a front with an air inlet and a back with an air outlet for the ingress and egress of air flow across the at least one electronics drawer, the cabinet including a front cover spaced from and positioned over the air inlet in the front of the frame, a back cover spaced from and positioned over the air outlet in the back of the frame, a first side air return at a first side of the frame and a second side air return at a second side of the frame; establishing air flow across the at least one electronics drawer of the frame employing at least one air moving device, wherein with egress of air flow through the air outlet of the frame, the air flow bifurcates at the back cover and returns to the air inlet of the frame via the first side air return, the second side air return and the front cover of the cabinet; and employing at least one air-to-liquid heat exchanger disposed within at least one of the cabinet and the frame for cooling the air flow across the at least one electronics drawer, and hence cooling of the at least one electronics component.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein "electronics system" comprises any system containing one or more heat generating components of a computer system or other electronics unit requiring cooling. The terms "electronics rack", "electronics frame", and "frame" are used interchangeably, and include any housing, rack, compartment, blade chassis, etc., having a heat generating component of a computer system or electronics system and may be for example, a stand-alone computer processor having high, mid or low end processing capability. In one embodiment, an electronics frame comprises multiple electronics drawers, each having one or more heat generating components disposed therein requiring cooling. "Electronics drawer" refers to any sub-housing, blade, book, drawer, node, compartment, etc., having one or more heat generating electronics components (e.g., comprising one or more electronic devices or integrated circuit chips) disposed therein. Each electronic drawer of an electronics frame may be movable or fixed relative to the electronics frame, with rack mounted electronics drawers and blades of a blade center system being two examples of drawers of an electronics frame to be cooled.

Further, as used herein, "heat exchanger" means any heat exchange mechanism through which coolant of a closed loop system such as described herein can circulate; and includes, one or more discrete heat exchange devices coupled either in series or in parallel. Each heat exchange device may comprise, for example, one or more coolant flow paths, formed of thermally conductive tubing (such as copper or other tubing) in thermal contact with a plurality of air-cooled cooling fins. Additionally, size, configuration and construction of the heat exchangers described herein can vary without departing from the scope of the present invention.

Figure 1:
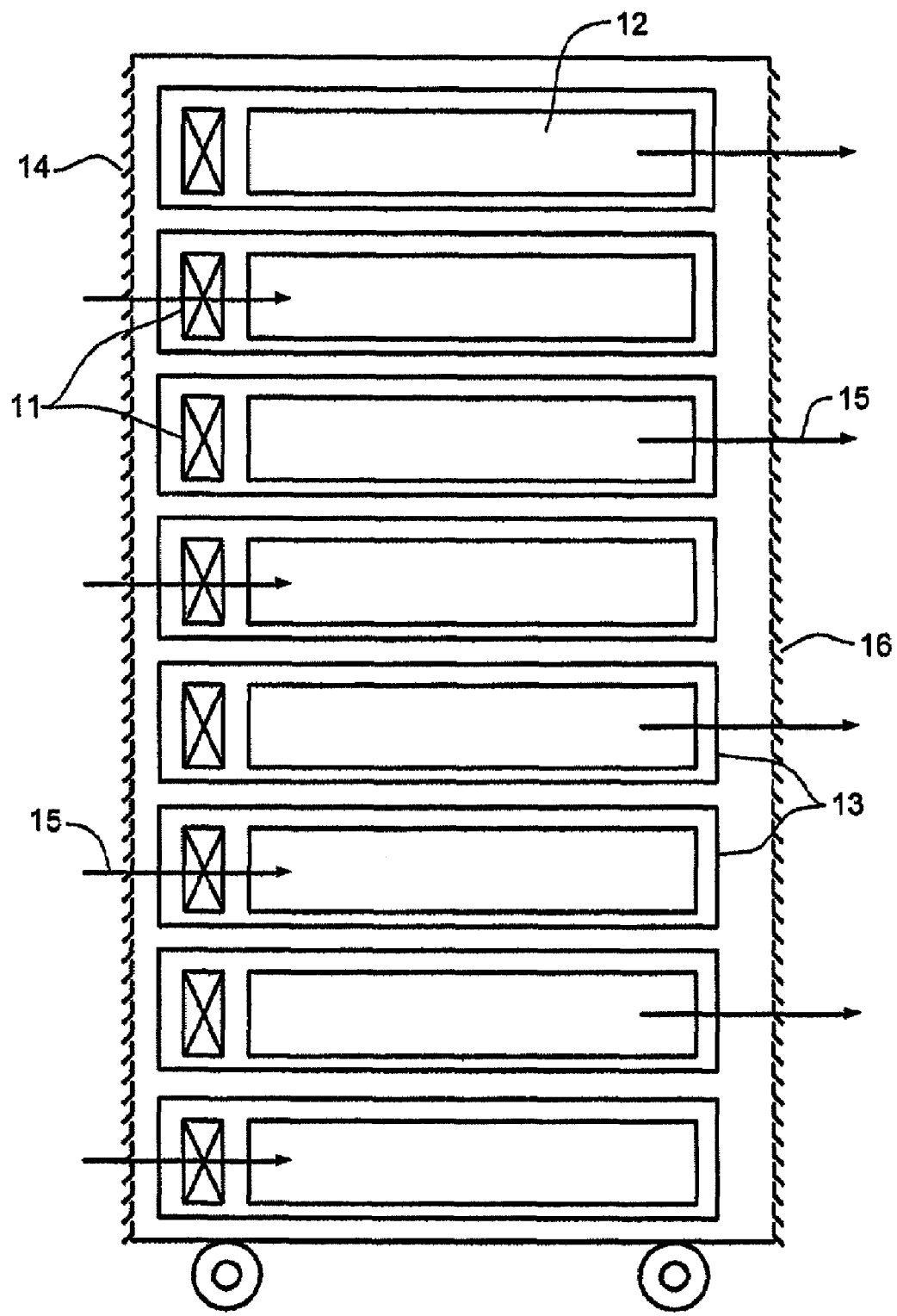
FIG. 1 depicts one embodiment of a conventional air-cooled frame with electronics in removable drawers.

As shown in FIG. 1, in rack-mounted configurations typical in the prior art, a plurality of air moving devices 11 (e.g., fans or blowers) provide the forced air flow 15 needed to cool the electronic components 12 within the electronics drawers 13 of the frame. Cool air is taken in through a louvered inlet cover 14 in the front of the frame and exhausted out of a louvered outlet cover 16 in the back of the frame.

Figure 2:
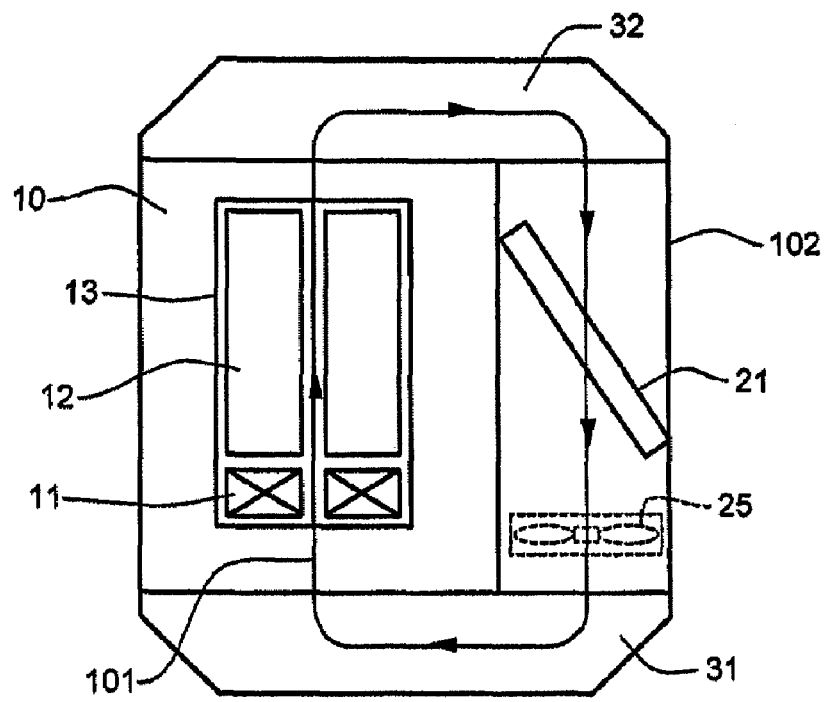
FIG. 2 is a cross-sectional plan view of a conventional, horizontal closed loop air and liquid heat removal system for an electronics frame, employing a side-mounted cooling system (with coolant connections to the heat exchanger not shown)

FIG. 2 shows a cross-sectional plan view of one embodiment of a closed loop cooling system such as described in detail in the above-referenced, commonly assigned U.S. Pat. No. 6,775,137. In this embodiment, the path for the closed loop air flow 101 is horizontal in nature in that it passes from side to side. Specifically, air chilled by the heat exchanger 21 located in a side-mounted, chilled air sub-frame 102 is directed to the front of the electronics frame 10 within the front cover 31. Heat dissipated by the electronics 12 is transferred to the air as it passes through the electronics rack propelled by air moving devices 11. The air is redirected into the side-mounted, chilled air sub-frame 102 by the back cover 32 thus completing the closed loop air flow. One or more air moving devices 25 may be added within the side-mounted, chilled air sub-frame 102 if required, for example, to handle the additional pressure drop associated with the closed loop flow. Note that heat exchanger 21 is positioned diagonally across the width of the sub-frame.

Figure 3:
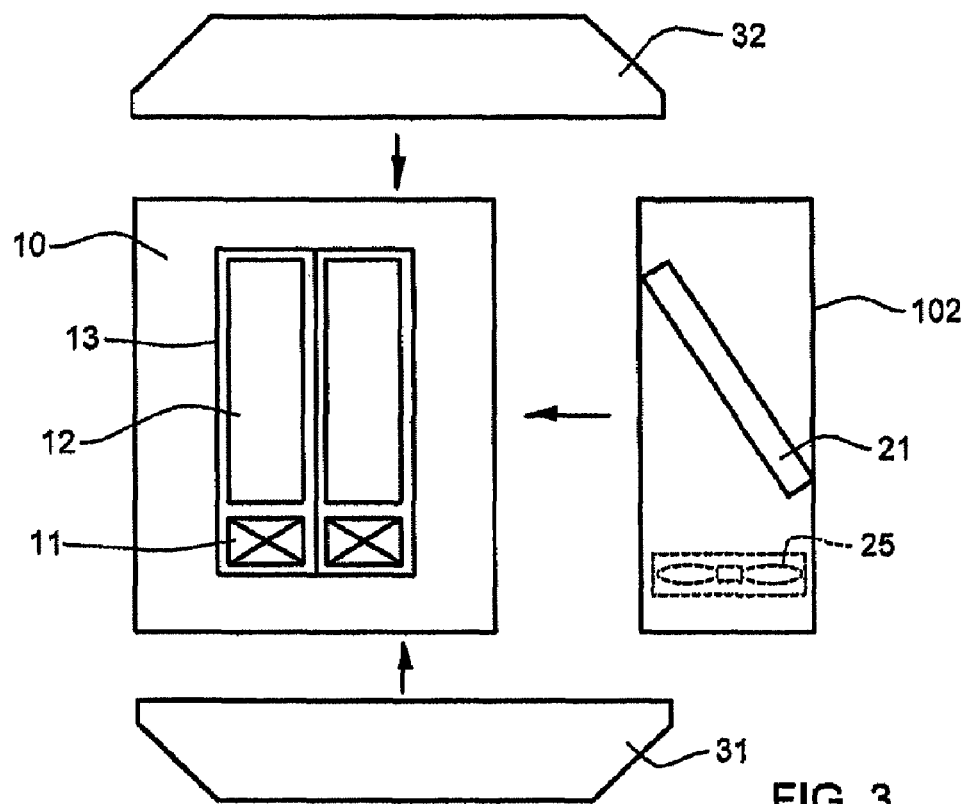
FIG. 3 is an exploded view of the electronics frame and heat removal system of FIG. 2.

To emphasize the nature of the side-mounted chilled air sub-frame, an exploded plan view of the assembly is shown in FIG. 3. Note that both the back 32 and front covers 31, as well as the chilled air sub-frame 102, may be shipped separately and assembled to the electronics frame in the field.

The closed loop cooling system of FIGS. 2 & 3 employs, in one example, facility cooled water passing through the heat exchanger. Heat absorbed by the air is rejected to the water passing through the liquid-side of the heat exchanger, thereby eliminating the server heat load on customer air conditioning. By supplying water below room temperature, the same scheme may be used to lower the cooling air temperature within the closed loop and accommodate even higher power dissipation with air cooling.

Although the closed loop cooling system of FIGS. 2 & 3 is an effective means of transferring heat generated by electronics devices inside an electronics rack without effecting the environment outside the rack, testing has shown that the concept may be limited in certain applications to heat removal of approximately 30 kW. Additionally, the single, horizontally disposed air flow path in the embodiment of FIGS. 2 & 3 includes two 180 degree turns, one in the front cover and one in the rear cover, resulting in a less than desirable air velocity pattern (velocity vectors), and leading to appreciable flow maldistribution into the electronics drawer. As a solution, the flow maldistribution could be minimized by employing additional baffling or changing the outer curvature of the covers. However, these solutions increase flow impedance, which further limits the overall performance of the cooling system.

Embodiments of the present invention use the principle of closed air circulation heat removal, and introduce a bifurcated air flow concept, coupled with placement of one or more heat exchangers within the electronics frame or within a cabinet encasing the electronics frame. By bifurcating the air flow, dual horizontal closed loop air flow paths can be created. These dual air flow paths result in a lower air flow impedance compared with the single closed loop air flow path employed in the cooling approach of FIGS. 2 & 3. Additionally, air flow balancing (e.g., associated with a blade center implementation) is much improved by the interaction of bifurcated dual air flow paths compared with a single air flow path in the cooling approach of FIGS. 2 & 3. Further advantages include:

- The height of the frame is not extended. This is significant in a room with sprinkler heads less than nine feet from the floor, as there is a safety specification requiring a minimum of eighteen inches from the top of the frame to the sprinkler head.
- Existing electronics frames can be readily retrofitted with an encasing cabinet characterized as described herein below.
- The positioning of the heat exchanger(s) allows for large dimensions with an associated large heat removal capability.

Figure 4:
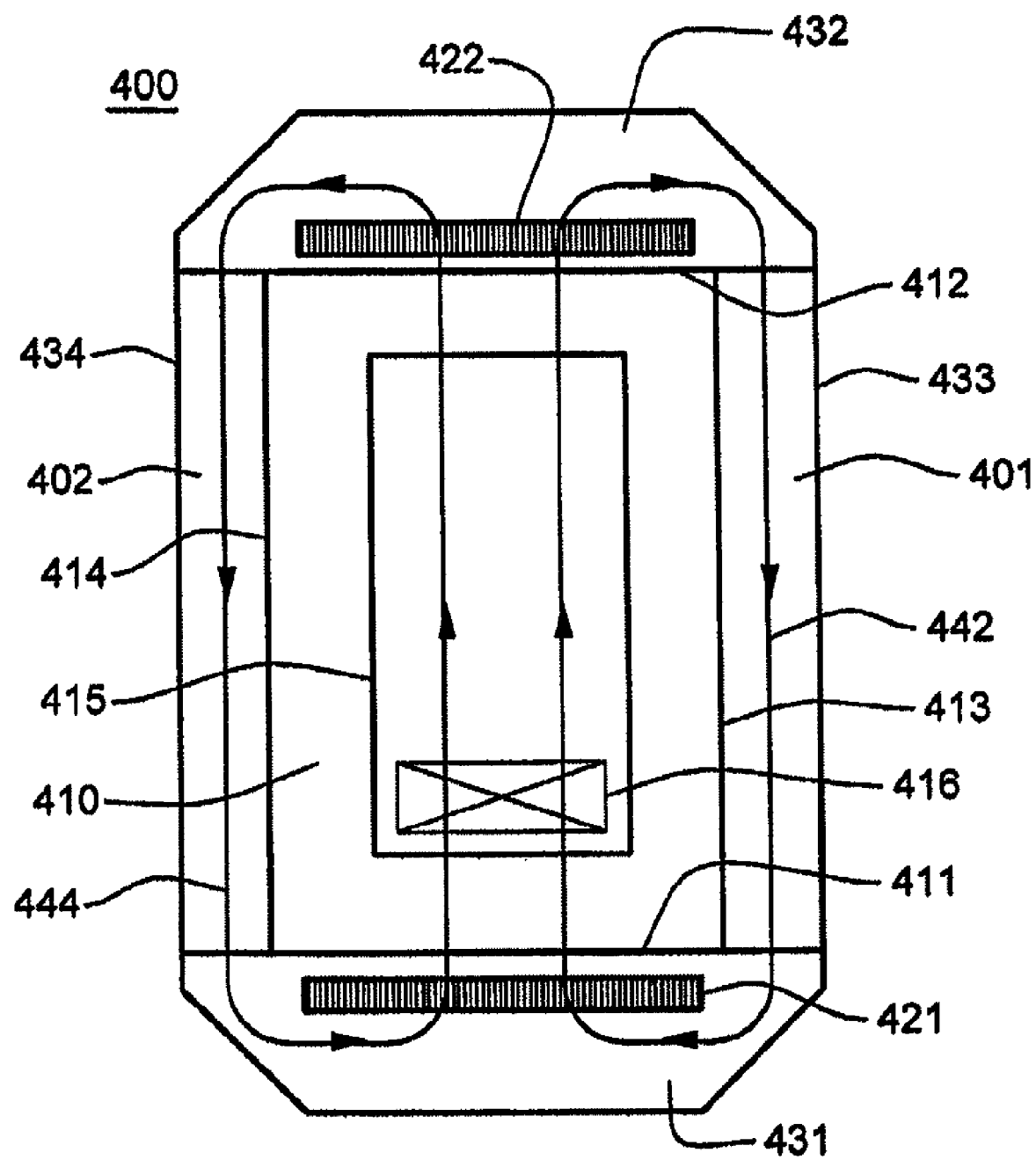
FIG. 4 is a cross-sectional plan view of one embodiment of a cooled electronics system comprising a closed loop air and liquid cooling system and an electronics frame, and employing bifurcated air flow, in accordance with an aspect of the present invention.

FIG. 4 depicts one detailed implementation of a cooled electronics system, generally denoted 400, in accordance with an aspect of the present invention. System 400 includes a frame 410 having at least one electronics drawer 415 disposed therein. Electronics drawer 415, which includes one or more electronics components to be cooled, has a front 411 with an air inlet and a back 412 with an air outlet for the ingress and egress of air flow, respectively, across the at least one electronics drawer 415. In the examples described herein, it is assumed (by way of example only) that air flow generally flows from the front to the back of the electronics frame. Frame 410 further includes a first side surface 413 and a second side surface 414.

A cabinet completely encases or encloses frame 410, with air circulating within the cabinet following one of multiple closed loop paths. The cabinet includes a front cover 431 positioned over the air inlet in the front 411 of the frame, a back cover 432 positioned over the air outlet in the back 412 of the frame, a first side air return or duct 401 and a second side air return or duct 402. First and second side air returns 401, 402 are formed (in one example) by spacing a first sidewall 433 of the cabinet from the first side surface 413 of the frame, and similarly spacing a second sidewall 434 of the cabinet from second side surface 414 of the frame. In one embodiment, the first side air return 401 and second side air return 402 are identically sized and symmetrical, and extend the height of the frame 410 from a lower portion to an upper portion thereof.

An inlet air-to-liquid heat exchanger 421 is shown in this example (and is assumed to be aligned over the air inlet in the front 411 of electronics frame 410), and an outlet air-to-liquid heat exchanger 422 is assumed to be aligned over the air outlet in the back 412 of electronics frame 410. An air moving device 416 (such as a fan or blower) is positioned in this embodiment within each drawer of the at least one electronics drawer 415 to establish air flow across the electronics drawer from the air inlet to the air outlet of the frame.

Due to the presence of the dual side air returns 401, 402, air flow exiting the electronics frame bifurcates in back cover 432, resulting in establishment of dual closed loop air flow paths 442, 444. These dual closed loop air flow paths 442, 444 result in a lower air flow impedance within the cabinet compared with a cooling approach such as depicted in FIGS. 2 & 3. Further, enhanced air flow balancing is achieved by bifurcating the air flow leaving the electronics frame.

Numerous variations to the cooled electronics system depicted in FIG. 4 are possible. For example, a single heat exchanger could be employed at either the air inlet or air outlet of the electronics frame, or if desired, a heat exchanger could be employed in one or both of the side air returns 401, 402. In the embodiment of FIG. 4, the side air returns do not house a heat exchanger, but serve simply as ducts to direct air from the back cover to the front cover of the cabinet. Also, note that in the embodiment illustrated, the inlet heat exchanger and outlet heat exchanger are disposed in series such that air flow passing across the at least one electronics drawer passes through first the inlet heat exchanger, and then the outlet heat exchanger.

Figure 5:
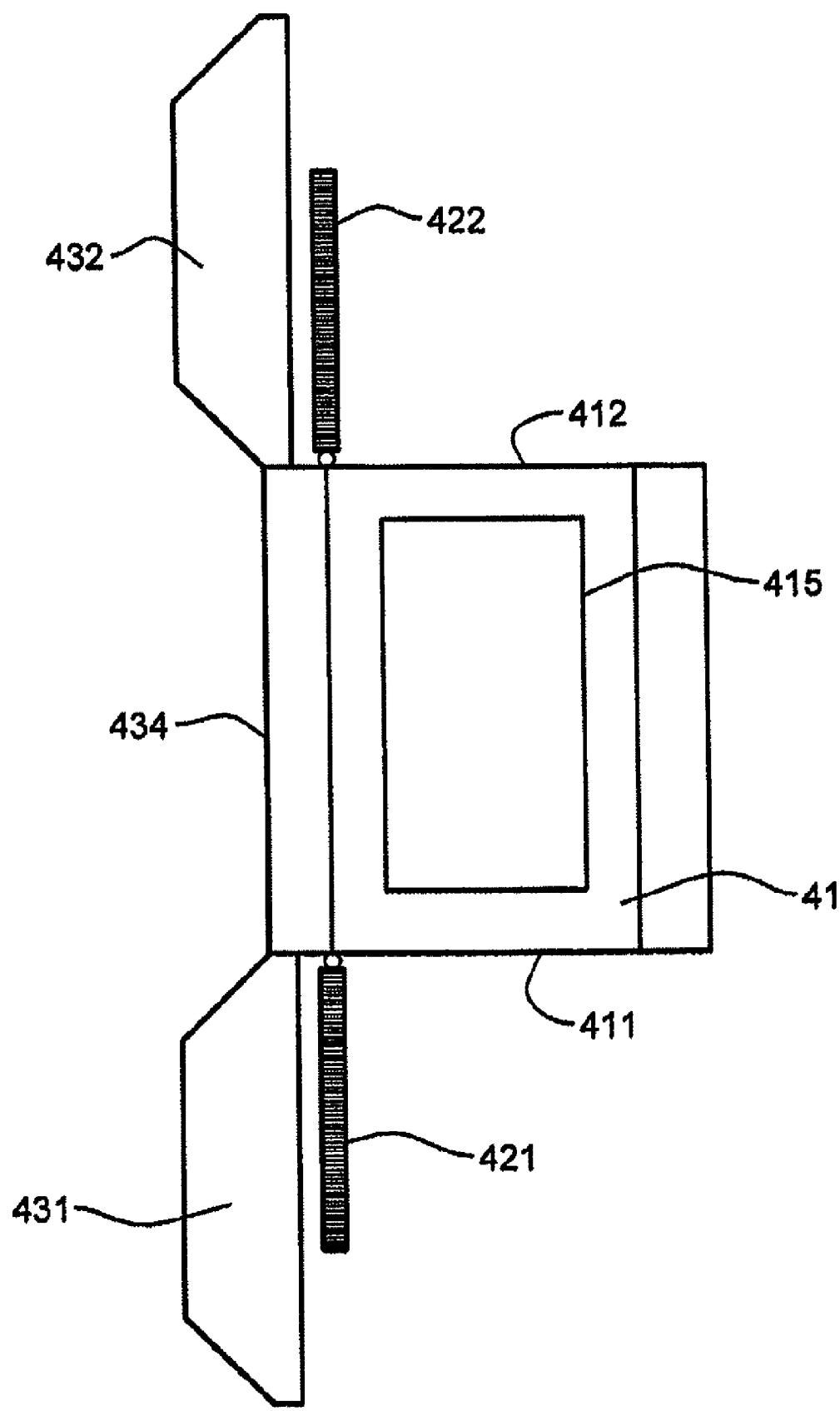
FIG. 5 depicts the cooled electronics system of FIG. 4 with the front and back covers, as well as the inlet heat exchanger and outlet heat exchanger pivoted open to allow access to the front and back of the electronics frame, in accordance with an aspect of the present invention.

FIG. 5 illustrates an enhancement to the cooled electronics system of FIG. 4, wherein inlet heat exchanger 421 and outlet heat exchanger 422 are hingedly connected to frame 410, for example, at a front 411 corner and back 412 corner, respectively, as illustrated. Further, front cover 431 and back cover 432 are hingedly mounted to a sidewall, such as second sidewall 434 of the cabinet, thereby allowing the covers and heat exchangers to each be independently moved. Further, by hingedly mounting both the inlet and outlet heat exchangers, and the front and back covers, ready access to frame 410, and in particular, to front 411 and back 412 of the frame is achieved for, for example, access to electronics drawer(s) 415.

Figure 6:
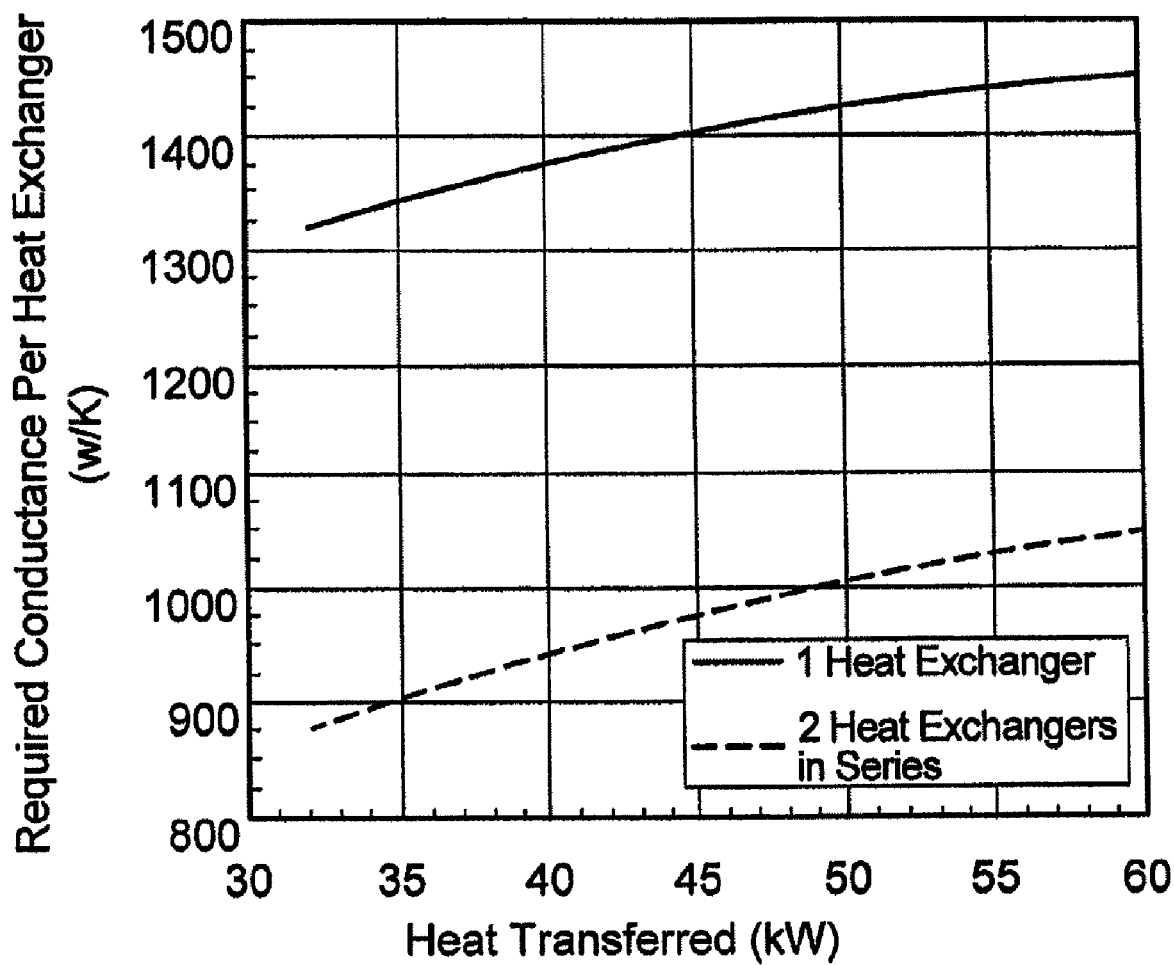
FIG. 6 is a graph of required conductance per heat exchanger versus heat transferred in a cooled electronics system such as depicted in FIGS. 4 & 5, and comparing a single air-to-liquid heat exchanger implementation with a dual, series-positioned air-to-liquid heat exchanger implementation, in accordance with an aspect of the present invention.

The thermal advantage of a two heat exchanger implementation can be appreciated through the graph of FIG. 6. FIG. 6 depicts heat exchanger conductance required to remove a given heat load for a representative high-end application (e.g., an IBM System P5 575). Note that the performance calculated is based on a relatively high air flow rate of 3200 cfm. The water flow rate through the heat exchangers is 15 gpm. The inlet air temperature to the electronics is required to be 24° C., and inlet water temperature in the heat exchangers is 18° C. The cooling approach of FIGS. 2 & 3 has been tested and has demonstrated an ability to remove up to 30 kW, but at a lower air flow (i.e., at 2400 cfm or less). Future high end electronics frames with, e.g., 40 kW and higher heat loads, will have significantly higher air flows associated with them as well. The dual heat exchanger approach of FIGS. 4 & 5 presents an ability to accommodate heat loads approaching 50 kW. Additionally, by employing the heat exchangers normal to the air flow, as shown in FIGS. 4 & 5, the performance and pressure drop penalties associated with the angled disposition of the heat exchanger in the cooling approach FIGS. 2 & 3 is eliminated.

Figure 7:
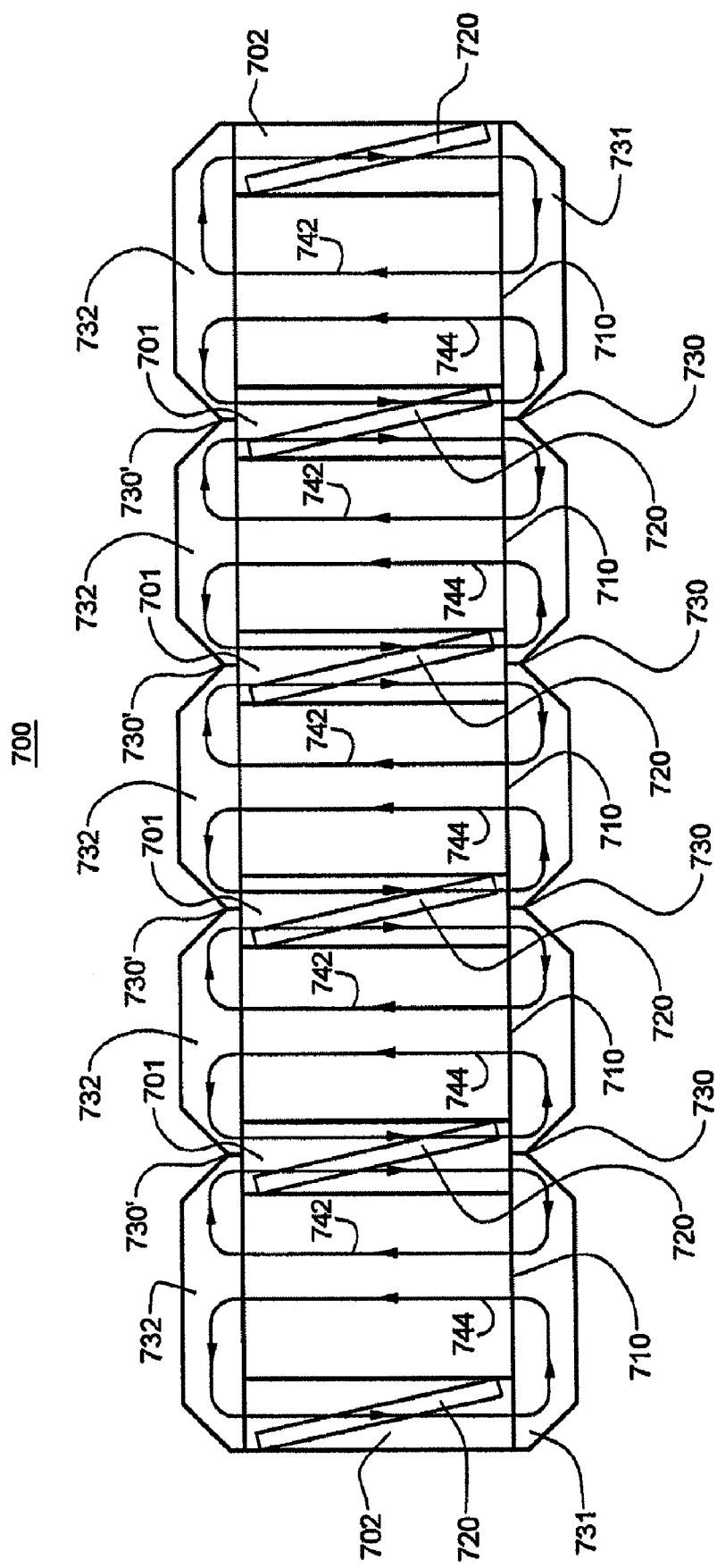
FIG. 7 is a cross-sectional plan view of a cooled electronics system wherein n frames are coupled together employing n+1 side air returns, with each electronics frame sharing at least one side air return with an adjacent electronics frame, in accordance with an aspect of the present invention.

FIG. 7 depicts an alternate implementation of a cooled electronics system, generally denoted 700, in accordance with an aspect of the present invention. In many high density data center applications, numerous electronics frames are positioned side-by-side in a row. In accordance with the implementation of FIG. 7, a shared side air return 701 is inserted between adjacent electronics frames and an end side air return 702 is disposed at each end of the row of electronics frames, resulting in each electronics frame having a side air return on either side thereof.

The cooled electronics system includes n frames 710, wherein n≧2, which are again encased by a cabinet, comprising in this example, n front covers 731, and n back covers 732, with each frame 710 having associated front and back covers. Air flow through each electronics frame 710 again bifurcates in the respective back cover 732 for return through side air returns 701 (702) to a respective front cover 731 and hence to the air inlet on the front of the electronics frame for passage back across the at least one electronics drawer to be cooled. Dual closed loop air flow paths 742, 744 are thus established within each electronics frame. As shown, front covers 731 are tapered at adjoining sides 730 to facilitate opening of each front cover independent of adjacent front covers, while back covers 732 are tapered at adjoining sides 730' to facilitate opening of each back cover independent of adjacent back covers. In one implementation, side air returns 701, 702 are again each formed as an air duct extending substantially the height of the respective frame, and one or more of the front covers 730 may hingedly connect, as well as one or more of the back covers 732.

Within each side air return 701, 702, an angled air-to-liquid heat exchanger 720 is disposed, as in the embodiments of FIGS. 2 & 3. Contrasted with the embodiments of FIGS. 2 & 3, however, the cooled electronics system 700 of FIG. 7 employs shared air returns and a bifurcated air flow approach, wherein a shared side air return allows mixing of air flow from adjacent electronics frames. The result is that quasi-closed loop air flow paths 742, 744 are established within each electronics frame, and a more compact cooled electronics system is achieved, while still maintaining the air flow balance advantages of dual air flow paths.

Although preferred embodiments have been depicted and described in detail herein, it will be apparent to those skilled in the relevant art that various modifications, additions, substitutions and the like can be made without departing from the spirit of the invention, and that these are therefore considered to be within the scope of the invention as defined in the following claims.

What is claimed is:

1. A cooled electronics system comprising:
   a frame including at least one electronics drawer containing at least one electronics component to be cooled, the frame having a front with an air inlet and a back with an air outlet for the ingress and egress of air flow across the at least one electronics drawer;
   a cabinet encasing the frame, the cabinet comprising a front cover spaced from and positioned over the air inlet in the front of the frame, a back cover spaced from and positioned over the air outlet in the back of the frame, a first side air return at a first side of the frame and a second side air return at a second side of the frame;
   an air moving device for moving air within the cabinet encasing the frame, the air moving device establishing air flow across the at least one electronics drawer, wherein with egress through the air outlet of the frame, the air flow bifurcates at the back cover and returns to the air inlet of the frame via the first side air return, the second side air return and the front cover of the cabinet; and
   at least one air-to-liquid heat exchanger disposed within at least one of the cabinet and the frame for facilitating cooling of the air flow across the at least one electronics drawer, and hence cooling of the at least one electronics component.

2. The cooled electronics system of claim 1, wherein the at least one air-to-liquid heat exchanger comprises at least one of an inlet heat exchanger aligned over at least a portion of the air inlet in the front of the frame and an outlet heat exchanger aligned over at least a portion of the air outlet in the back of the frame.

3. The cooled electronics system of claim 1, wherein the at least one air-to-liquid heat exchanger is multiple air-to-liquid heat exchangers, the multiple air-to-liquid heat exchangers comprising an inlet heat exchanger aligned over at least a portion of the air inlet in the front of the frame and an outlet heat exchanger aligned over at least a portion of the air outlet in the back of the frame, wherein air flow across the at least one electronics drawer passes through both the inlet heat exchanger and the outlet heat exchanger.

4. The cooled electronics system of claim 3, wherein the inlet heat exchanger hingedly mounts to the front of the frame, the outlet heat exchanger hingedly mounts the back of the frame, and the front cover and the back cover each hingedly mount to a sidewall of the cabinet and encase the front and back, respectively, of the frame.

5. The cooled electronics system of claim 1, wherein the at least one air-to-liquid heat exchanger is disposed within at least one of the first side air return and the second side air return.

6. The cooled electronics system of claim 5, wherein the at least one air-to-liquid heat exchanger is multiple air-to-liquid heat exchangers, and wherein a first air-to-liquid heat exchanger is disposed within the first side air return, and a second air-to-liquid heat exchanger is disposed within the second side air return.

7. The cooled electronics system of claim 1, wherein the first side air return and the second side air return are similarly sized side air ducts, and wherein the at least one air moving device is disposed to create a first air flow path and a second air flow path through the cabinet and the frame, the first air flow path passing through the first side air return and the second air flow path passing through the second side air return.

8. The cooled electronics system of claim 7, wherein the first air flow path extends horizontally through the frame, the back cover, the first side air return and the front cover, and the second air flow path extends horizontally through the frame, the back cover, the second side air return and the front cover.

9. The cooled electronics system of claim 7, wherein a first sidewall of the cabinet encases and is spaced from the first side of the frame to define the first side air return and a second sidewall of the cabinet encases and is spaced from the second side of the frame to define the second side air return.

10. The cooled electronics system of claim 1, further comprising multiple frames, each frame including at least one electronics drawer containing at least one electronics component to be cooled, and each frame having a front with an air inlet and a back with an air outlet for the ingress and egress of air flow across the at least one electronics drawer, and wherein each frame has associated therewith a front cover spaced from and positioned over the air inlet in the front of the frame, and a back cover spaced from and positioned over the air outlet in the back of the frame, and wherein the multiple frames are aligned in a row and at least two adjacent frames in the row are spaced with a shared side air return disposed therebetween, each shared side air return being employed by the adjacent frames for return of at least a portion of the air flow egressing through the air outlet of each frame to the air inlet of the frame, and wherein the at least one air-to-liquid heat exchanger is disposed within the shared side air return for simultaneous cooling of at least a portion of the air flow from the adjacent frames.

11. A cooled electronics system comprising:

n frames, wherein $n \geq 2$, each frame of the n frames including at least one electronics drawer containing at least one electronics component to be cooled, and each frame of the n frames having a front with an air inlet and a back with an air outlet for the ingress and egress of air flow across the at least one electronics drawer;

a cabinet encasing the n frames, the cabinet comprising n front covers and n back covers, each front cover being spaced from and positioned over an air inlet in the front of a respective frame and each back cover being spaced from and positioned over an air outlet in the back of a respective frame, the cabinet further comprising n+1 side air returns, each frame having a side air return disposed on a first side thereof and on a second side thereof, at least one side air return of the n+1 side air returns being a shared side air return disposed between two adjacent frames of the n frames;

multiple air moving devices for moving air within the cabinet encasing the n frames, the multiple air moving devices establishing within each frame air flow across the at least one electronics drawer thereof, wherein with egress through the air outlet in the back of each frame, the air flow bifurcates at the back cover and returns to the air inlet of the frame via the two side air returns disposed on the first and second sides of the frame and the front cover, and wherein for at least two adjacent frames at least one side air return of the two side air returns on either side thereof comprises the at least one shared side air return, the at least one shared side air return receiving a portion of the air flow egressing from both of the at least two adjacent frames; and multiple air-to-liquid heat exchangers disposed within at least one of the cabinet and the n frames for facilitating cooling of air flow across the at least one electronics drawer of each frame, and hence, cooling of the at least one electronics component therein.

12. The cooled electronics system of claim 11, wherein the multiple air-to-liquid heat exchangers comprise n+1 air-to-liquid heat exchangers, each air-to-liquid heat exchanger being disposed within a respective side air return of the n+1 side air returns of the cabinet.

13. The cooled electronics system of claim 11, wherein the at least one shared side air return is n−1 shared side air returns of the n+1 side air returns, each shared side air return being disposed between two adjacent frames of the n frames, and wherein each shared side air return receives a portion of air flow egressing from both of its two adjacent frames.

14. The cooled electronics system of claim 13, wherein the multiple air-to-liquid heat exchangers are n+1 air-to-liquid heat exchangers, each air-to-liquid heat exchanger being disposed within a respective side air return of the n+1 side air returns, and wherein the air-to-liquid heat exchanger disposed within each shared side air return simultaneously cools at least a portion of the air flow from each of its adjacent frames.

15. The cooled electronics system of claim 11, wherein the n+1 side air returns are similarly sized side air ducts, and wherein the multiple air moving devices are disposed to create a first air flow path and a second air flow path associated with each frame of the n frames.

16. The cooled electronics system of claim 15, wherein for each frame, the first air flow path extends horizontally through the frame, the respective back cover, a first side air return of the n+1 side air returns and the respective front cover, and the second air flow path extends horizontally through the frame, the respective back cover, a second side air return of the n+1 side air returns, and the respective front cover.

* * * * *